US011464149B2

(12) United States Patent
Kawai et al.

(10) Patent No.: US 11,464,149 B2
(45) Date of Patent: Oct. 4, 2022

(54) SYSTEM FOR MONITORING OUTSIDE WORK AREA OF COMPONENT MOUNTING MACHINE

(71) Applicant: FUJI CORPORATION, Chiryu (JP)

(72) Inventors: Hidetoshi Kawai, Chiryu (JP); Fumitaka Maeda, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 360 days.

(21) Appl. No.: 16/328,457

(22) PCT Filed: Sep. 26, 2016

(86) PCT No.: PCT/JP2016/078206
§ 371 (c)(1),
(2) Date: Feb. 26, 2019

(87) PCT Pub. No.: WO2018/055754
PCT Pub. Date: Mar. 29, 2018

(65) Prior Publication Data
US 2021/0168976 A1 Jun. 3, 2021

(51) Int. Cl.
*H05K 13/08* (2006.01)
*H04N 7/18* (2006.01)

(52) U.S. Cl.
CPC ........... *H05K 13/081* (2018.08); *H04N 7/183* (2013.01); *H04N 7/188* (2013.01)

(58) Field of Classification Search
CPC ....... H05K 13/081; H04N 7/183; H04N 7/188
(Continued)

(56) References Cited

U.S. PATENT DOCUMENTS

| 7,849,363 | B2 | 12/2010 | Mochizuki et al. |
| 2002/0124394 | A1 | 9/2002 | Slechta et al. |

(Continued)

FOREIGN PATENT DOCUMENTS

| EP | 1 343 363 A1 | 9/2003 |
| JP | 1-251458 A | 10/1989 |

(Continued)

OTHER PUBLICATIONS

International Search Report dated Dec. 20, 2016 in PCT/JP2016/078206 filed Sep. 26, 2016.

*Primary Examiner* — Joseph G Ustaris
*Assistant Examiner* — Matthew David Kim
(74) *Attorney, Agent, or Firm* — Oblon, McClelland, Maier & Neustadt, L.L.P.

(57) ABSTRACT

A component mounting includes an external monitoring camera that images an outside work area that is an area outside of the component mounting machine at which an operator performs work with respect to the component mounting machine. The outside work area of the component mounting machine includes at least an area where a feeder is set, and a monitoring target is at least a state during and after completion of setting the feeder on the component mounting machine and during and after completion of setting component supply tape on the feeder. By looking at a recorded image or a real time image displayed on a display device by using the external monitoring camera to capture an outside work area of the component mounting machine, it is possible to check the state of the monitoring target on which an operator performed work in the outside work area of the component mounter.

6 Claims, 2 Drawing Sheets

(58) Field of Classification Search
USPC .......................................................... 348/86
See application file for complete search history.

(56) References Cited

U.S. PATENT DOCUMENTS

| | | | | |
|---|---|---|---|---|
| 2005/0161498 | A1* | 7/2005 | Byskov | H05K 13/087 235/376 |
| 2006/0075631 | A1* | 4/2006 | Case | H05K 13/0812 29/709 |
| 2010/0180434 | A1* | 7/2010 | Moriya | H05K 13/0888 700/121 |
| 2010/0242267 | A1* | 9/2010 | Tsukagoshi | H05K 13/0419 29/739 |
| 2013/0000114 | A1* | 1/2013 | Kitagawa | H05K 13/0888 29/832 |
| 2016/0014909 | A1* | 1/2016 | Faraci | H05K 3/00 156/64 |
| 2016/0162739 | A1* | 6/2016 | Ishiguri | G07C 5/0866 348/148 |

FOREIGN PATENT DOCUMENTS

| | | |
|---|---|---|
| JP | 2-16891 A | 1/1990 |
| JP | 9-102700 A | 4/1997 |
| JP | 2008-140248 A | 6/2008 |
| JP | 2009-76633 A | 4/2009 |

* cited by examiner

SYSTEM FOR MONITORING OUTSIDE WORK AREA OF COMPONENT MOUNTING MACHINE

TECHNICAL FIELD

The present application is related to a system for monitoring an outside work area of a component mounting machine, the outside work area being an area outside the component mounting machine at which an operator performs work with respect to the component mounting machine.

BACKGROUND ART

For example, as disclosed in patent literature 1 (JP-A-2009-76633), there is a component mounting machine that mounts components on a circuit board for which a camera is used to image the inside of the component mounting machine, and by processing the captured image, it is determined whether the size of the circuit board loaded in the component mounting machine is correct, and in a case in which it is determined that the board size is incorrect, conveyance of the circuit board by the conveyor is stopped, and a warning is issued to an operator via sound or display.

Also, as disclosed in patent literature 2 (JP-A-2008-140248), there is a component mounting machine for which, when an error occurs during operation of the component mounting machine, to enable cause-finding work for the error, a trace log that lists operation history data for each function performed during operation of the component mounting machine is outputted in a specified character code, the trace log is memorized as a log file, the log file is read when trying to find out the cause of an error, and the trace log in the log file is analyzed to discover the error location or cause.

CITATION LIST

Patent Literature

Patent literature 1: JP-A-2009-76633
Patent literature 2: JP-A-2008-140248

BRIEF SUMMARY

Technical Problem

There are cases in which the cause of an error at a component mounting machine cannot be discovered using only the methods of patent literature 1 and 2 above. For example, when an error such as a component pickup error occurs due to tape being inappropriately loaded on a feeder set on the component mounting machine, it is not possible to identify the error cause because it is not possible to capture a state of tape inappropriately loaded on a feeder using a camera that images the inside of the component mounting machine. Further, for a work mistake such as inappropriately loading tape on a feeder, it is difficult to identify the cause by analyzing the trace log. Therefore, when an error occurs due to a work mistake, there is a delay in identifying the cause, which causes a problem of a worse operating rate of the component mounting machine.

Thus, an object of the present disclosure is to provide a system for monitoring an outside work area of a component mounting machine capable of clarifying an error cause when an error occurs due to an operation mistake by monitoring for the presence of an operation mistake that causes an error while the component mounting machine is operating.

Solution to Problem

To solve the above problem, the present disclosure is for monitoring an outside work area of a component mounting machine, and includes: an external monitoring camera configured to image an external work area that is an area outside of a component mounting machine at which an operator performs work with respect to the component mounting machine; a display device configured to display an image captured by the external monitoring camera; and an image recording device configured to record an image captured by the external monitoring camera, wherein the display device is configured to display the images in real time or the images reproduced by being read from the image recording device such that it is possible to check a state of a monitoring target on which an operator performed work in the outside work area. Accordingly, because an outside work area of a component mounting machine is imaged by an external monitoring camera, it is possible to check a state of a monitoring target on which an operator performed work in the outside work area of the component mounting machine by looking at an image displayed on a display device in real time or reproduced by being read from a recording device, therefore, it is possible to monitor for the presence of a work mistake that causes an error during operation of the component mounting machine, and discover an operation mistake before an error occurs, thereby preventing errors, and, even in a case in which the work mistake leads to an error, the fact that the work mistake caused the error is made clear from the image of the outside work area.

In this case, the outside work area of the component mounting machine may include at least an area where feeders are set, and the monitoring target may be at least a state during and after completion of setting the feeder on the component mounting machine and during and after completion of setting component supply tape on the feeder. Because work of setting a feeder on a component mounting machine and work of setting component supply tape on a feeder is typical work performed by an operator in the outside work area of the component mounting machine, if the monitoring target is a state during and after completion of setting the feeder on the component mounting machine and during and after completion of setting component supply tape on the feeder, it is possible to monitor in real time for operation mistakes that typically occur in the outside work area, and to identify operation mistakes that cause an error at the time that the error occurs at the component mounting machine.

Also, the display device may be any one of a monitor of a computer configured to control the component mounting machine provided with the external monitoring camera, a monitor of a host computer configured to manage a component mounting line provided with the component mounting machine, or a mobile terminal or monitor of an external computer connected by a network to the host computer.

Also, the image recording device may record the image captured by the external monitoring camera from a time point that is a specified period backwards from a time at which a trigger occurred, the trigger being an error signal of the component mounting machine, and, with respect to data of the recorded image, a trace log of the component mounting machine, information of the same time, a recording time, and error information are linked. Accordingly, when an error occurs at a component mounting machine, the recorded images of the outside work area of the component mounting machine can be checked linked to analysis results of a trace log and error information, thereby enabling more detailed analysis of the cause of the error at the component mounting machine.

Further, an image recognition device configured to process the image captured by the external monitoring camera to recognize the state of the monitoring target may also be provided, and, in a case in which it is detected based on recognition results of the image recognition device that the state of the monitoring target is different to a normal state, an indication that the state of the monitoring target is different to the normal state may be displayed on the display device. Accordingly, it is possible to automatically detect work mistakes using image processing technology, warnings of the work mistakes can be displayed, and operators can be prompted to remedy the work mistake.

DESCRIPTION OF EMBODIMENTS

Figure 1:
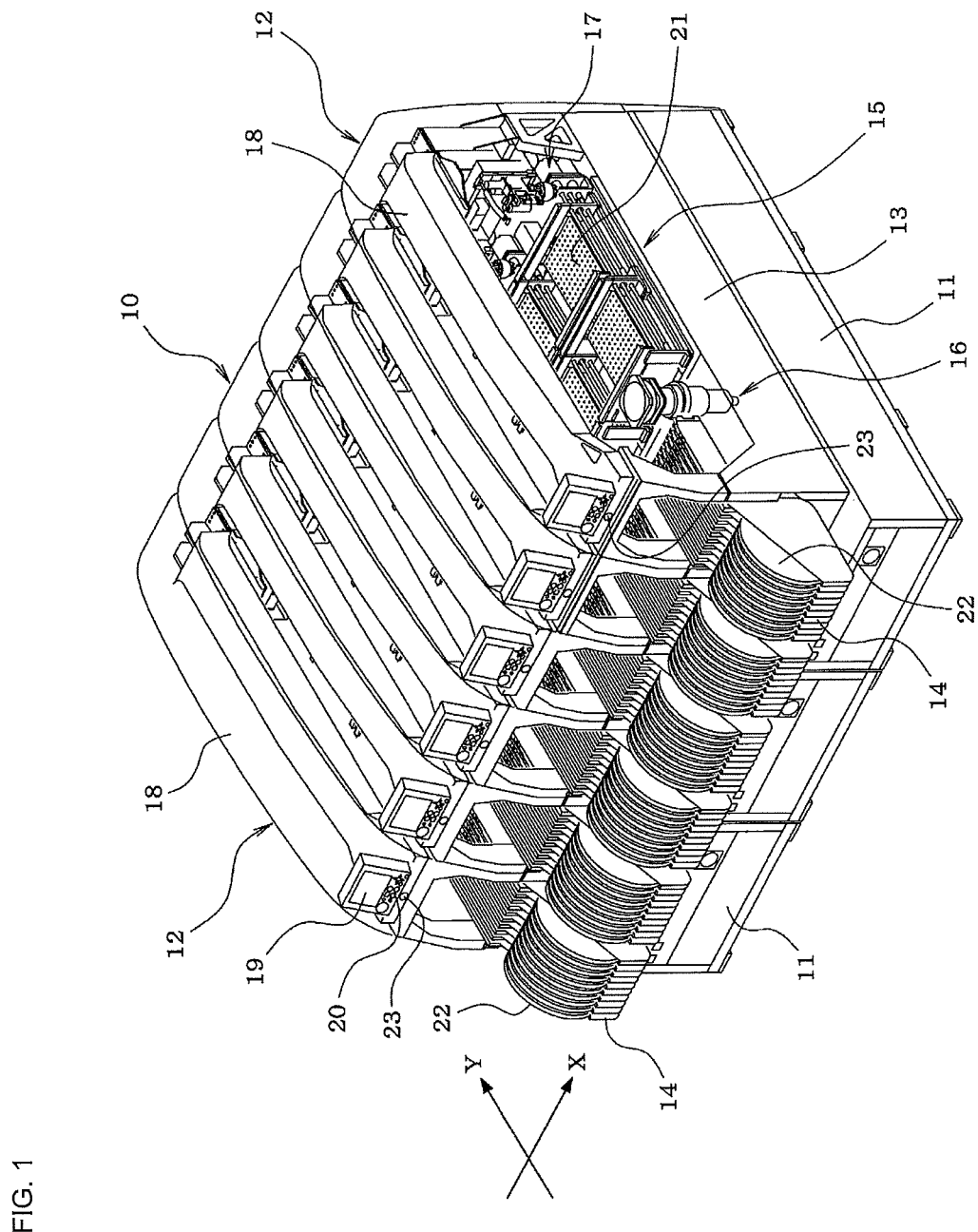
FIG. 1 is a perspective view of a modular component mounting line illustrating an embodiment of the present disclosure.

An embodiment of the disclosure is described below. First, the configuration of component mounting line 10 will be described based on FIG. 1.

Multiple component mounting machines 12 are exchangeably arranged adjacent in a conveyance direction of a circuit board (X direction) on base 11 of component mounting line 10. Each component mounting machine is provided with, on main body bed 13, feeders 14 that supply components, conveyor 15 that conveys circuit board 21, component imaging camera 16 for imaging a component held by a suction nozzle (not shown), mounting head 17 provided with one or multiple suction nozzles, and the like. Mounting head 17 is moved in the XY directions by an XY moving mechanism (not shown) and performs component pickup operation and component mounting operation. On a front section of upper frame 18 of each component mounting machine 12, monitor 19 (display device) such as an LCD display or CRT, and operation section 20 such as operation keys or a touch panel are provided. If operation section 20 is a touch panel, operation section 20 may be displayed on the screen of monitor 19.

Each component mounting machine 12 conveys a circuit board 21 unloaded from an upstream component mounting machine 12 using conveyor 15 to a specified position and positions the circuit board 21 by clamping it with a clamping mechanism (not shown), and picks up a component supplied by feeder 14 using a suction nozzle of mounting head 17, moves the component from the pickup position to an imaging position, images the component using component imaging camera 16, performs image recognition of the component, then mounts the component on the circuit board 21 that is on conveyor 15.

Also, provided on a front section of upper frame 18 of each component mounting machine 12 (a portion on a side at which an operator performs work) is external monitoring camera 23 that images an outside work area that is an area outside of each component mounting machine 12 at which an operator performs work with respect to the component mounting machine 12. In this case, the outside work area of each component mounting machine 12 includes at least an area where feeders 14 are set, and a monitoring target is at least a state during and after completion of setting a feeder 14 on the component mounting machine 12 and during and after completion of setting component supply tape on a feeder 14.

Because work of setting a feeder 14 on a component mounting machine 12 and work of setting component supply tape on a feeder 14 is typical work performed by an operator in the outside work area of the component mounting machine 12, if the monitoring target is a state during and after completion of setting a feeder 14 on the component mounting machine 12 and during and after completion of setting component supply tape on a feeder 14 (in detail, a state during and after completion of setting reel 22 on which is wound component supply tape on the feeder 14, and during and after completion of setting the component supply tape pulled out from the reel onto the feeder 14), it is possible to monitor in real time for operation mistakes that typically occur in the outside work area, and to identify operation mistakes that cause an error at the time that the error occurs at the component mounting machine.

Figure 2:
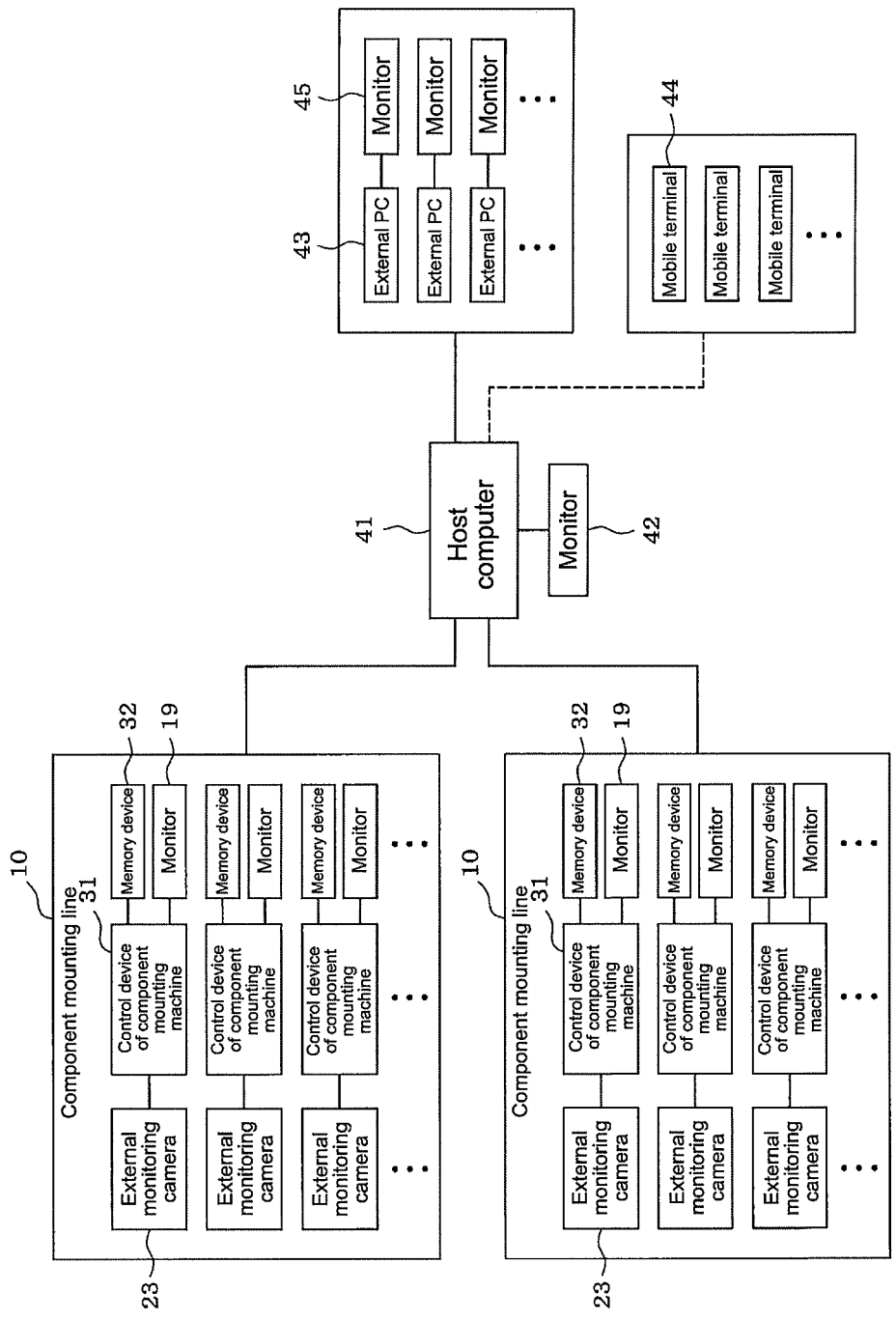
FIG. 2 is an overall block diagram of an outside work area monitoring system.

Control device 31 (refer to FIG. 2) that controls operation of each component mounting machine 12 is configured mainly from a computer and during operation (during production) controls operation of a suction nozzle of mounting head 17 picking up a component supplied by a feeder 14, moving the component from the pickup position to an imaging position, imaging the component using component imaging camera 16, performing image recognition of the component, then mounting the component on circuit board 21 on conveyor 15. Connected to control device 31 of each component mounting machine 12 are the above external monitoring camera 23, monitor 19, operation section 20, and the like, as well as memory device 32 (refer to FIG. 2) that memorizes various control programs and the like that control operation of each function of component mounting machine 11. Memory device 32 is configured from a rewritable non-volatile storage medium such as a hard-disk device and functions as an image recording device that records images captured by external monitoring camera 23.

Also, control device 31 of each component mounting machine 12, during operation (during production), saves a trace log with operation history data of each function of component mounting machine 12 and data of operation history of feeders 14 in a specified character code as a log file in memory device 32. Control device 31 of each component mounting machine 12, when recording an image captured by external monitoring camera 23 on memory device 32, records from a time point that is a specified period backwards from a time point at which a trigger occurred, the trigger being an error signal of component mounting machine 12, and, with respect to the data of the recorded image, links the trace log of component mounting machine 12, information of the same time, the recording time, and error information, and is provided with a function to, when an error occurs at component mounting machine 12, to link the image of external monitoring camera 23 recorded on memory device 32 with the trace log of the component mounting machine 12, information of the same time, the recording time, and the error information and to display these on monitor 19.

Further, control device 31 of each component mounting machine 12 functions as an image recognizing device that recognizes a state of a monitoring target (a state during and after completion of setting a feeder 14 on the component mounting machine 12 and during and after completion of setting component supply tape on a feeder 14) by processing the image captured by external monitoring camera 23, then, when detecting that the state of the monitoring target is different to a normal state based on the results of the image recognition, displays a warning of that fact on monitor 19 of component mounting machine 12 or the like, or issues a warning sound to an operator.

Images captured by external monitoring camera 23 of component mounting machines 12 that configure component mounting line 10 and data of the image recognition results (normal or error) are sent to host computer 41 that manages component mounting line 10. Host computer 41, from the received images of external monitoring camera 23 of each of the component mounting machines 12, displays an image from external monitoring camera 23 of a component mounting machine 12 selected by an administrator or the like who operates host computer 41 on monitor 42 (display device) of host computer 41, and when detecting that the state of the monitoring target is different to a normal state based on the results of the image recognition, displays a warning of that fact on monitor 42 of host computer 41, or issues a warning sound to the administrator. One or multiple component mounting lines 10 may be managed by host computer 41.

Data of the results of image recognition processing (normal or error) and images from external monitoring camera 23 of each component mounting machine 12 received by host computer are also sent to external computer (also referred to as "external PC") 43 or mobile terminal 44 connected by a network to host computer 41, and images from external monitoring camera 23 of a component mounting machine 12 selected by a user (administrator, operator, engineer, or the like) are displayed on monitor 45 (display device) of external PC 43 or a screen of mobile device 44, and when it is detected that the state of the monitoring target is different to a normal state based on the results of the image recognition, a warning of that fact is displayed on monitor 45 of external PC 43 or the screen of mobile terminal 44, or a warning sound is issued.

Note that, when images from external monitoring camera 23 of component mounting machine 12 are displayed on monitor 42 of host computer 41, monitor 45 of external PC 43, or the screen of mobile terminal 44, images from only one external monitoring camera 23 selected by a user may be displayed, or the screen of mobile terminal 44 or monitors 42 or 45 may be divided, and images of multiple external monitoring cameras 23 may be displayed on one screen. Alternatively, images from one or multiple external monitoring cameras 23 may be displayed on the screen of mobile terminal 44 or monitors 42 or 45 by being switched automatically for images of another external monitoring camera 23 at a specified time interval.

Also, host computer 41, external PC 43, and mobile terminal 44 are also equipped with a function to download and reproduce images of external monitoring camera 23 memorized on memory device 32 of each component mounting machine 12 linked to the trace log of each component mounting machine 12 and information of the same time.

With an embodiment described above, because an outside work area of a component mounting machine 12 is imaged by external monitoring camera 23, it is possible to check a state of a monitoring target on which an operator performed work in the outside work area of the component mounting machine 12 by looking at an image displayed on monitor 19, 42, 45 or mobile terminal 44 in real time or reproduced by being read from memory device 32 of component mounting machine 12, therefore, it is possible to monitor for the presence of a work mistake that causes an error during operation of the component mounting machine 12, and discover an operation mistake before an error occurs, thereby preventing errors, and, even in a case in which the work mistake leads to an error, the fact that the work mistake caused the error is made clear from the image of the outside work area. Therefore, even if an error occurs due to a work mistake, it is known quickly that the cause of the error was an operation mistake, the error can be resolved in a short time, and the operating rate of component mounting machine 12 is improved by that amount. Also, because the frequency of work mistakes and the contents of the work mistakes can be understood from the monitoring results, it is easy to issue "Work mistake prevention" alerts to operators, and such work mistakes can be reduced.

Further, in the present embodiment, images captured by external monitoring camera 23 are recorded from a time point that is a specified period backwards from a time point at which a trigger occurred, the trigger being an error signal of component mounting machine 12, and with respect to the data of the recorded image, the trace log of component mounting machine 12, information of the same time, the recording time, and error information are linked, therefore, when an error occurs at component mounting machine 12, it is possible to check the recorded images of the outside work area of component mounting machine 12 linked to analysis results of the trace log and error information, enabling more detailed analysis of the cause of the error that occurred at the component mounting machine 12.

Further, with the present embodiment, also provided is an image recognition device configured to process the image captured by the external monitoring camera to recognize the state of the monitoring target, and, in a case in which it is detected based on recognition results of the image recognition device that the state of the monitoring target is different to a normal state, a warning is displayed of that fact, therefore, it is possible to automatically detect a work mistake using image processing technology, a warning of the work mistake can be displayed, and an operator can be prompted to remedy the work mistake.

Note that, in the configuration example of FIG. 1, an external monitoring camera 23 is provided on each of the component mounting machines 12, however, one external monitoring camera 23 may image the outside work areas of multiple component mounting machines 12 all at once by containing the outside work areas of multiple component mounting machines 12 in the field of view of the single external monitoring camera 23.

Also, in a case in which there are two outside work areas, one at the front side and one at the rear side of the component mounting machine, external monitoring cameras may be provided at the front and rear sides of the component mounting machine so as to monitor the outside work areas at the front and the rear.

It goes without saying that various other changes can be made without departing from the scope of the disclosure, such as changes to the location at which external monitoring camera 23 is provided, and monitoring items other than feeders 14 within the outside work area of component mounting machine 12.

REFERENCE SIGNS LIST

10: component mounting line;
12: component mounting machine;
14: feeder;
19: component mounting machine monitor (display device);

22: reel;
23: external monitoring camera;
31: control device of component mounting machine (computer, image recognition device);
32: memory device (image recording device);
41: host computer;
42; host computer monitor (display device);
43: external PC (external computer);
44: mobile terminal;
45: external PC monitor (display device)

The invention claimed is:

1. A system for monitoring an outside work area of a component mounting machine, comprising:
   an upper frame of the component mounting machine;
   an external monitoring camera on a front section of the upper frame and configured to image an external work area that is an area outside of the component mounting machine at which an operator performs work with respect to the component mounting machine, the outside work area including an area in which feeders of the component mounting machine are set;
   a display device configured to display an image captured by the external monitoring camera;
   an image recording device configured to record an image captured by the external monitoring camera; and
   an image recognition device configured to process the image captured by the external monitoring camera to recognize a state of a monitoring target, wherein
   the display device is configured to display the images in real time and the images reproduced by being read from the image recording device to check the state of the monitoring target on which the operator performed the work in the outside work area,
   the monitoring target is a state of the outside work area including the area in which the feeders of the component mounting machine are set during mounting of the feeders on the component mounting machine and after completion of the mounting of the feeders on the component mounting machine, and
   the image recognition device detects that the state of monitoring target is different from a normal state based on image recognition of images of the feeders during the mounting of the feeders on the component mounting machine and after completion of the mounting the feeders on the component mounting machine.

2. The system for monitoring an outside work area of the component mounting machine according to claim 1, wherein the display device is any one of a monitor of a computer configured to control the component mounting machine provided with the external monitoring camera, a monitor of a host computer configured to manage a component mounting line provided with the component mounting machine, or a mobile terminal or monitor of an external computer connected by a network to the host computer.

3. The system for monitoring an outside work area of the component mounting machine according to claim 1, wherein the image recording device records the image captured by the external monitoring camera from a time point that is a specified period backwards from a time at which a trigger occurred, the trigger being an error signal of the component mounting machine, and, with respect to data of the image, a trace log of the component mounting machine, information of the time point and error information are linked.

4. The system for monitoring an outside work area of the component mounting machine according to claim 1, further comprising
   wherein in a case in which it is detected based on recognition results of the image recognition device that the state of the monitoring target is different to the normal state, an indication that the state of the monitoring target is different to the normal state is displayed on the display device.

5. The system for monitoring an outside work area of the component mounting machine according to claim 1, wherein the display device is on the front section of the upper frame.

6. The system for monitoring an outside work area of the component mounting machine according to claim 1, wherein the monitoring target further includes a state of the outside work area including the area in which the feeders of the component mounting machine are set during setting of a component supply tape on one of the feeders and after the setting of the component supply tape on the one of the feeders.

* * * * *